(12) United States Patent
Nakayama et al.

(10) Patent No.: US 7,476,882 B2
(45) Date of Patent: Jan. 13, 2009

(54) CALIBRATION METHOD FOR ELECTRON-BEAM SYSTEM AND ELECTRON-BEAM SYSTEM

(75) Inventors: Yoshinori Nakayama, Sayama (JP); Yasunari Sohda, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 218 days.

(21) Appl. No.: 11/431,705

(22) Filed: May 11, 2006

(65) Prior Publication Data

US 2006/0255272 A1      Nov. 16, 2006

(30) Foreign Application Priority Data

May 16, 2005     (JP) .............................. 2005-142095

(51) Int. Cl.
G21K 7/00        (2006.01)
G01N 23/00       (2006.01)
A61N 5/00        (2006.01)
G21G 5/00        (2006.01)

(52) U.S. Cl. .................... 250/492.3; 250/310; 250/306; 250/307; 250/492.1; 250/492.2

(58) Field of Classification Search ................. 250/310, 250/306, 307, 31, 492.1, 492.2, 492.3
See application file for complete search history.

(56) References Cited

U.S. PATENT DOCUMENTS 5,136,169 A *   8/1992   Smith et al. .............. 250/491.1
5,191,200 A *   3/1993   van der Werf et al. .... 250/201.4
6,875,982 B2*   4/2005   Bedell et al. ................. 250/307
2004/0021075 A1*   2/2004   Nikitin ........................ 250/307
2005/0045819 A1*   3/2005   Bedell et al. ................. 250/307
2006/0237644 A1*  10/2006   Nakayama .................. 250/307
2006/0255272 A1*  11/2006   Nakayama et al. .......... 250/310
2007/0114449 A1*   5/2007   Nakayama ............... 250/491.1

FOREIGN PATENT DOCUMENTS

JP   2003-022773   1/2003
JP   2004-251682   9/2004
JP   2004-340838   12/2004

* cited by examiner

*Primary Examiner*—Bernard E Souw
(74) *Attorney, Agent, or Firm*—Mattingly, Stanger, Malur & Brundidge, P.C.

(57) ABSTRACT

There is provided an electron-beam calibration technology whereby deflection calibration used in the electron-beam system can be performed with a high accuracy. A one-dimensional diffraction grating is located such that direction of the grating becomes parallel to an electron-beam scanning direction. Next, the electron-beam scanning is horizontally performed while displacing the electron-beam scanning in the perpendicular direction so that the electron-beam scanning displacement quantity will coincide with pitch size of the grating. From a secondary-electron signal image acquired, based on the presence or absence of moiré interference fringes, it can be judged whether or not the deflection calibration in the direction perpendicular to the electron-beam scanning has been correctly performed.

14 Claims, 11 Drawing Sheets

BEAM SCANNING DIRECTION

CALIBRATION METHOD FOR ELECTRON-BEAM SYSTEM AND ELECTRON-BEAM SYSTEM

INCORPORATION BY REFERENCE

The present application claims priority from Japanese application JP2005-142095 filed on May 16, 2005, the content of which is hereby incorporated by reference into this application.

BACKGROUND OF THE INVENTION

1. Field of the Invention

The present invention relates to electron-beam length measurement technologies used in fabrication processes for such devices as semiconductor integrated circuits. More particularly, it relates to a high-accuracy electron-beam length measurement system and a calibration method therefor.

2. Description of the Related Art

In the conventional calibration method for the electron-beam length measurement system, as disclosed in Patent Document 1 for example, the calibration is performed using a moiré diffraction image which is acquired by scanning an electron beam on a two-dimensional arrangement lattice sample with a certain angle set thereto.

SUMMARY OF THE INVENTION

On account of high-accuracy implementation of the electron-beam length measurement system, it is increasingly becoming required that the deflection calibration therefor be replaced by the calibration which is based on an absolute dimension. This situation requires that the pitch size of a sample to be used for the calibration be replaced by a pitch size standardized as the absolute dimension. Also, the electron-beam length measurement system is so requested as to implement high-accuracy length measurements in semiconductor fabrication processes. Accordingly, the length measurements on insulating materials and materials which are likely to be easily deformed are absolutely necessary. This situation necessitates implementation of the measurements using a low-current electron beam whose beam irradiation gives rise to less damage. In the conventional two-dimensional arrangement lattice sample, however, there existed none of the technologies for arranging the lattice points with a pitch size which is precise in the transverse and longitudinal directions. Neither did the methods for measuring the pitch size precisely. Also, since the diffraction grating is constituted by an assembly of the lattice points, in the case of the low-current electron beam, secondary-electron signals acquired for each scanning are small in number. This resulted in a drawback that the accuracy becomes worse. In the method disclosed in JP-A-2003-022773, in the case of scanning the electron beam with an angle set to the lattice-point arrangement, locations at which the beam and the lattice points coincide with each other decrease in number. This fact resulted in a decrease in the acquired secondary-electron signals in number as well, which became a cause for degradation in the calibration accuracy. Moreover, when the point lattice is used, signals between the respective lattice points cannot be acquired. This resulted in a problem that the secondary-electron signal intensity acquired is not high enough.

In the present invention, in order to allow the deflection be calibrated with a high accuracy in the electron-beam length measurement system, the calibration is performed such that the calibration will be divided into a direction perpendicular to the electron-beam scanning direction and a direction parallel thereto. Also, different methods will be used for the divided calibrations each. Regarding the deflection calibration in the direction parallel to the electron-beam scanning direction, first, a one-dimensional diffraction grating is located such that the direction of the diffraction grating becomes perpendicular to the scanning direction. Then, the pitch size of the diffraction grating is determined from a secondary-electron signal waveform acquired by scanning the electron beam. Next, the deflection is calibrated so that the determined pitch size of the diffraction grating and an actual pitch size of the diffraction grating will coincide with each other.

Moreover, the one-dimensional diffraction grating is located such that the direction of the diffraction grating becomes parallel to the electron-beam scanning direction. Next, the electron-beam scanning is horizontally performed while displacing the electron-beam scanning in the perpendicular direction so that the electron-beam scanning displacement quantity will coincide with the pitch size of the diffraction grating. Here, from a secondary-electron signal image acquired, based on the presence or absence of moiré interference fringes, it can be judged whether or not the deflection calibration in the direction perpendicular to the electron-beam scanning direction has been correctly performed. Also, both the one-dimensional diffraction grating and the electron-beam scanning are of linear configurations. As a result, if the one-dimensional diffraction grating and the electron-beam scanning are caused to coincide with each other, the resultant secondary-electron signal intensity acquired proves larger than the one in the case of the lattice points. Accordingly, an excellent secondary-electron signal image can be acquired even in the case of the exceedingly-weak electron beam. Furthermore, the precise pitch size of the one-dimensional diffraction grating can be determined from diffraction-angle measurement on diffraction light diffracted thereby. This fact makes it possible to guarantee the absolute accuracy of the above-described calibration. Also, if the one-dimensional diffraction grating is of the superlattice cross-section structure of a multi-layer crystal composed of compound semiconductors, the precise pitch size thereof can be determined by measuring lattice number of the multi-layer crystal using devices such as transmission electron microscope. This fact makes it possible to guarantee the absolute accuracy of the above-described calibration.

Hereinafter, the enumeration will be given below concerning representative configuration examples of the present invention.

(1) An electron-beam system used in the present invention includes the following configuration components: An electron-optics system for performing an irradiation with an electron beam, a function for performing an electron-beam scanning on a one-dimensional-diffraction-grating calibrating mark by displacing the electron-beam scanning thereon by a predetermined transfer quantity, and a function for detecting reflected electrons or secondary electrons, and performing, from the detection result, calibration for a deflection quantity or deflection distortion of the electron beam, the reflected electrons or secondary electrons being emitted from the calibrating mark and a proximity thereto by the electron-beam scanning.

(2) An electron-beam calibration method according to the present invention includes the following steps: Scanning an electron beam on a pattern of a one-dimensional-diffraction-grating calibrating mark provided on a stage, the electron beam being emitted from an electron source, displacing the electron beam by a constant transfer quantity by using a deflection unit, detecting reflected electrons or secondary electrons emitted from the calibrating mark and a proximity thereto by the electron-beam scanning, and performing, from the detection result, calibration for a deflection quantity or deflection distortion of the electron beam.

According to the present invention, it becomes possible to implement the electron-beam system and a graphics-drawing method which allow the deflection distortion in the electron-beam system to be calibrated with an excellent accuracy. In particular, it becomes possible to implement the high-accuracy deflection calibration even in a low-acceleration and low-current electron-beam length measurement system.

Other objects, features and advantages of the invention will become apparent from the following description of the embodiments of the invention taken in conjunction with the accompanying drawings.

DESCRIPTION OF THE INVENTION

Figure 1A:
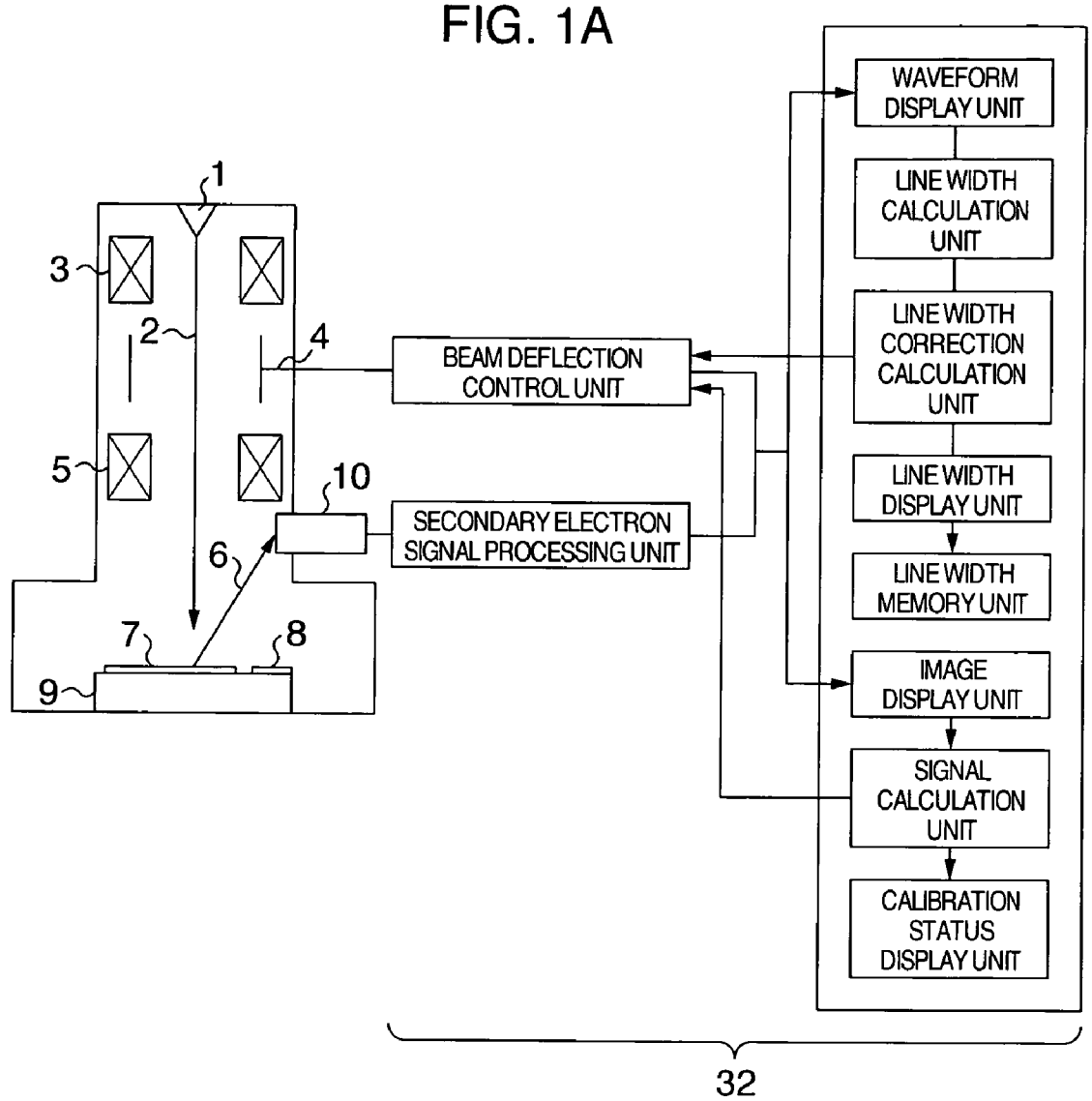
FIG. 1A and FIG. 1B are diagrams for illustrating the system configuration of the present invention.

Hereinafter, referring to the drawings, the explanation will be given below concerning embodiments of the present invention.

Embodiment 1

FIG. 1A illustrates the configuration of an electron-beam length measurement system used in the present embodiment.

An electron beam 2 emitted from an electron gun (i.e., electron source) 1 is scanned on a sample 7 by using a deflector 4. A deflection calibrating mark 8 exists on a stage 9. Also, using an electron detector 10 for detecting secondary electrons 6 generated by the electron beam, a secondary-electron image is displayed, then making length measurement using the secondary-electron signal waveform. The length measurement is made as follows: In a line-width calculation unit, the pattern line-width is determined from the secondary-electron signal waveform. Next, in a line-width calibration calculation unit, the pattern line-width determined in the line-width calculation unit is corrected, then being displayed and memorized as the length-measurement value. Confirmation of the length-measurement position is performed using the secondary-electron image in an image display unit.

Here, the explanation will be given below concerning a beam deflection calibration method with respect to the direction which is perpendicular to an electron-beam scanning direction. First of all, the stage is positioned so that the calibrating mark is directly under the electron beam. Next, the electron beam is scanned on a one-dimensional diffraction grating pattern which is perpendicular to the electron-beam scanning direction, then determining the pitch size from the secondary-electron signal waveform in the line-width calculation unit. Moreover, the line-width calibration calculation unit makes a comparison between the pitch size determined in the line-width calculation unit and a pitch size determined using an optical diffraction measurement method. Furthermore, the calibration calculation unit makes a correction to a beam deflection control unit so that the difference resulting from the comparison will become equal to zero, thereby performing the deflection calibration. After the calibration has been completed, once again, the electron beam is scanned on the one-dimensional diffraction grating pattern, then determining the pitch size from the secondary-electron signal waveform in the size calculation unit. Moreover, the line-width calibration calculation unit makes a comparison between the pitch size determined in the line-width calculation unit and the pitch size determined using the optical diffraction measurement method. Furthermore, the calibration calculation unit makes a correction to the measurement value so that the difference resulting from the comparison will become equal to zero.

Figure 1B:
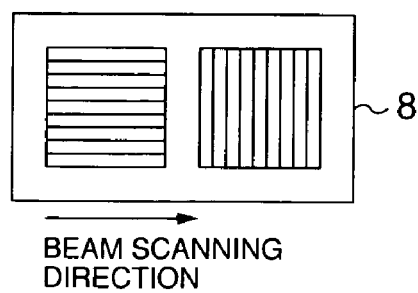

Next, in accordance with processing steps illustrated in FIG. 2, the explanation will be given below concerning a beam deflection calibration method with respect to the direction which is horizontal to the electron-beam scanning direction. First of all, the stage 9 illustrated in FIG. 1A is displaced, thereby causing the calibrating mark 8 to be positioned directly under the electron beam. The calibrating-mark substrate 8 illustrated in FIG. 1B includes not only the above-explained one-dimensional diffraction grating pattern which is perpendicular to the electron-beam scanning direction, but also a one-dimensional diffraction grating pattern which is horizontal to the electron-beam scanning direction.

Figure 3:
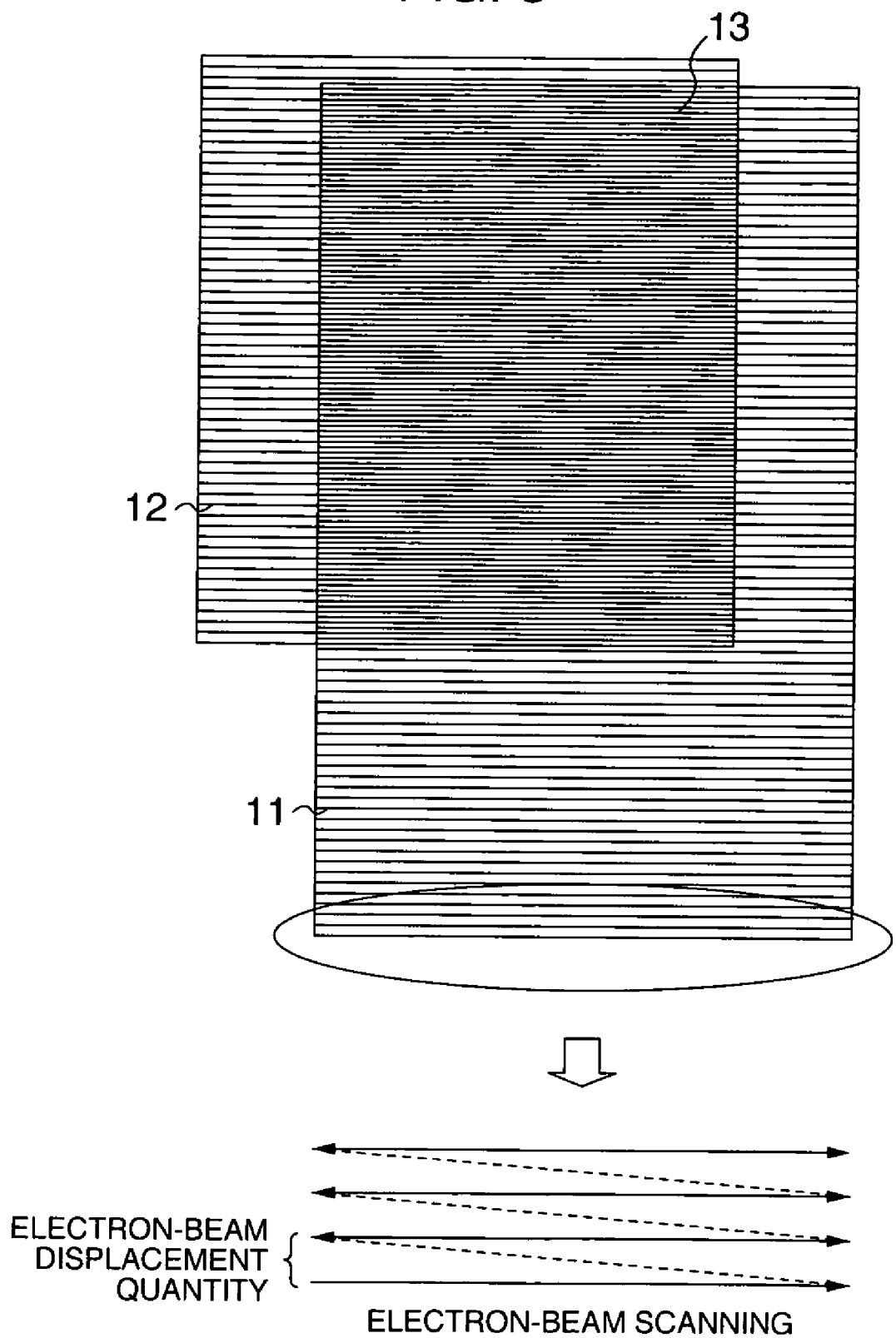
FIG. 3 is a diagram for explaining the calibration method of the present invention.
Figure 4:
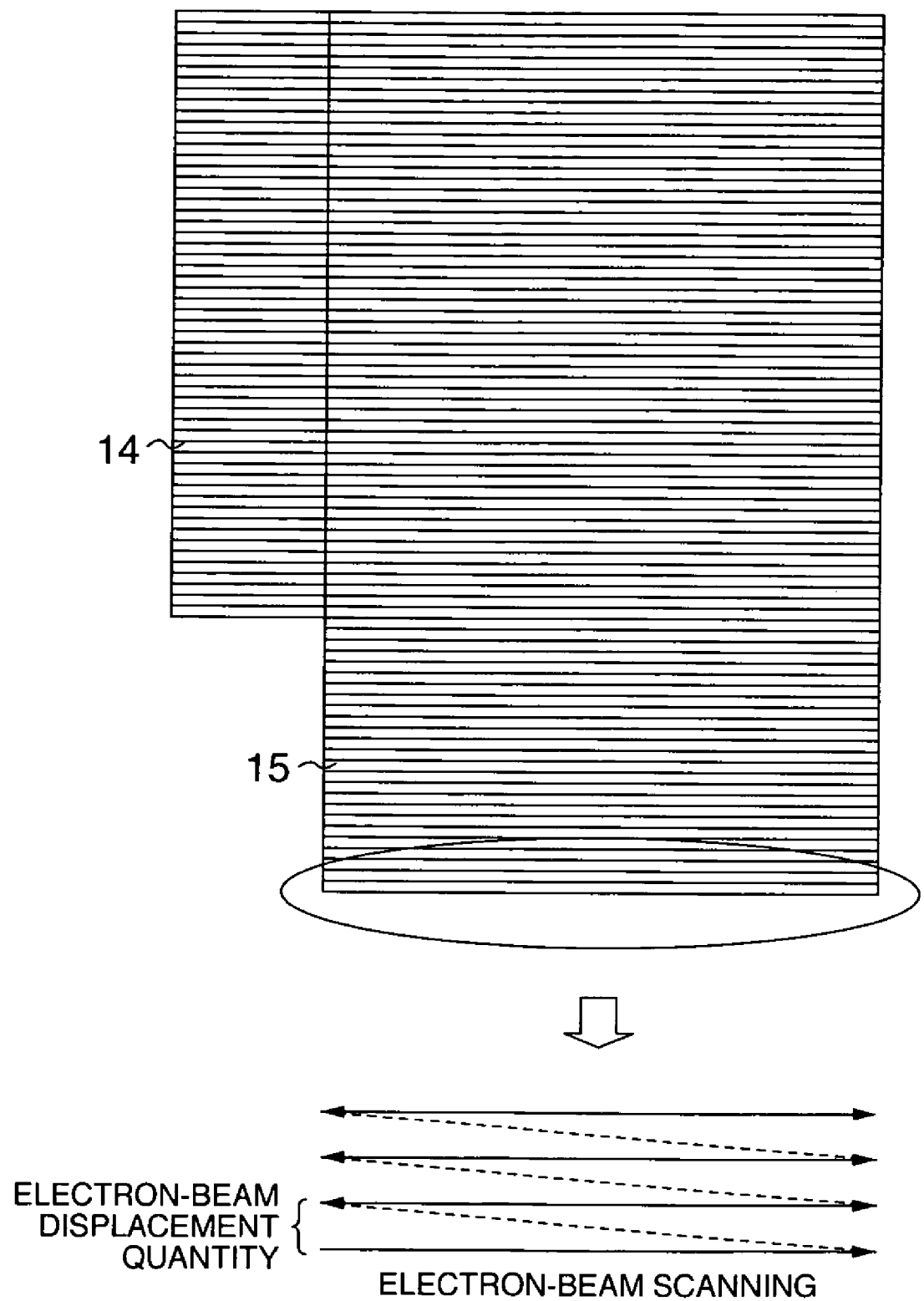
FIG. 4 is a diagram for explaining the calibration result of the present invention.

Next, as illustrated in FIG. 3, the electron beam is scanned on the one-dimensional diffraction grating pattern 12 which is horizontal to the electron-beam scanning direction. Using the beam deflection control unit, the electron beam is horizontally scanned while displacing the electron beam in the direction perpendicular to the electron-beam scanning direction so that the electron-beam scanning displacement quantity coincides with the pitch size of the one-dimensional diffraction grating pattern 12 determined using the optical diffraction measurement method. A secondary-electron image acquired in this way is displayed on the image display unit. As a result, in the secondary-electron image 11, moiré interference fringes 13 are observed in the electron-beam scanning portion on the above-described diffraction grating 12. This phenomenon is caused to occur by a situation where the pitch size of the diffraction grating 12 and the electron-beam scanning displacement quantity do not coincide with each other, i.e., there occurs a shift in the scanning position. Also, it can be confirmed from FIG. 3 that the beam deflection displacement quantity is uniformly larger than the pitch size of the diffraction grating 12. Therefore, as illustrated in FIG. 4, the electron beam is scanned once again on the one-dimensional diffraction grating pattern 14 horizontal to the electron-beam scanning direction, while the beam deflection control unit is adjusted until none of the moiré interference fringes have been observed within a secondary-electron image 15, or until the position shift quantity has become smaller than a predetermined threshold value. When the adjustment has been completed, a correct beam deflection parameter for adjusting the beam deflection displacement quantity is memorized into a calibration parameter memory unit inside a signal calculation unit. Based on this parameter, the beam deflection control unit corrects the beam deflection displacement quantity. Then, the secondary-electron image 15 after being corrected is displayed on a calibration status display unit.

The calibration for the beam deflection displacement quantity using the one-dimensional diffraction grating patterns has been performed based on the images acquired. It is also possible, however, to perform the calibration for the beam deflection displacement quantity by executing waveform analysis of the moiré interference fringes in the calculation units.

Figure 5:
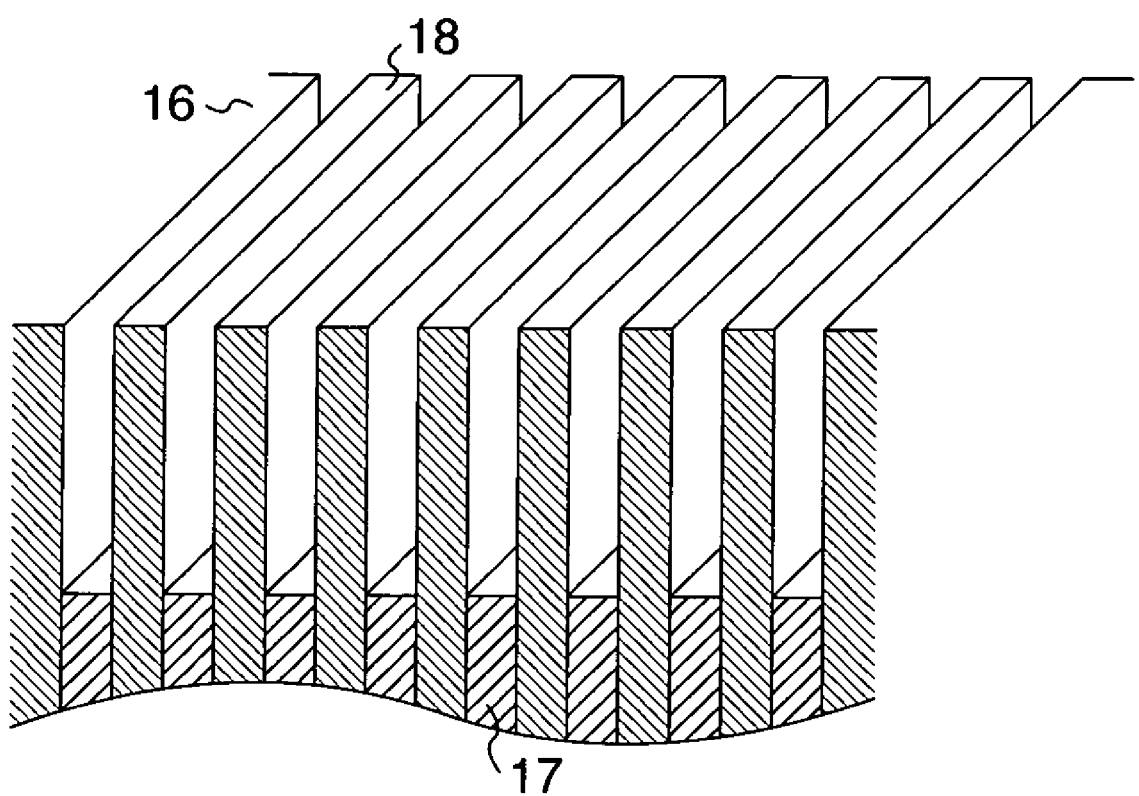
FIG. 5 is a diagram for explaining the diffraction-grating pattern by a superlattice sample of the present invention.

The above-described one-dimensional diffraction gratings are manufactured on the silicon substrate using laser interference exposure method and anisotropic etching. The pitch size of the one-dimensional diffraction gratings has been determined with an accuracy of 1 nm or less with reference to the pitch size of 240 nm by using the optical diffraction measurement method. As a result, the deflection calibration based on absolute values is made executable in the horizontal and perpendicular directions to the electron-beam scanning direction. Not only can the length-measurement value be acquired as the absolute dimension value, but also can the secondary-electron images with a precise magnification be acquired. This fact makes it possible to implement the high-accuracy length measurement, and simultaneously allows the system status to be confirmed in the calibration status display unit at whatever time. Furthermore, as a microscopic one-dimensional diffraction grating, a diffraction grating can be mentioned which uses the superlattice cross-section structure of a multi-layer crystal composed of compound semiconductors. This diffraction grating, which is used as a deep-groove sample as illustrated in FIG. 5, is manufactured as follows: The cross section of a structure, which is formed by repeating 5-nm-thick GaAlAs layers 17 and 5-nm-thick GaAs layers 18 over 40 layers on a GaAs substrate 16, is etched using an acid solution which causes only the GaAlAs layers 17 to be etched. By measuring lattice number of the multi-layer crystal using devices such as transmission electron microscope, the pitch line-width of this one-dimensional diffraction grating can be acquired as being the pitch size of 10 nm as an absolute dimension with the accuracy of 1 nm or less. This fact makes it possible to guarantee the absolute accuracy of the above-described calibration. The use of this one-dimensional diffraction grating allows implementation of the calibration with a higher magnification.

Figure 6:
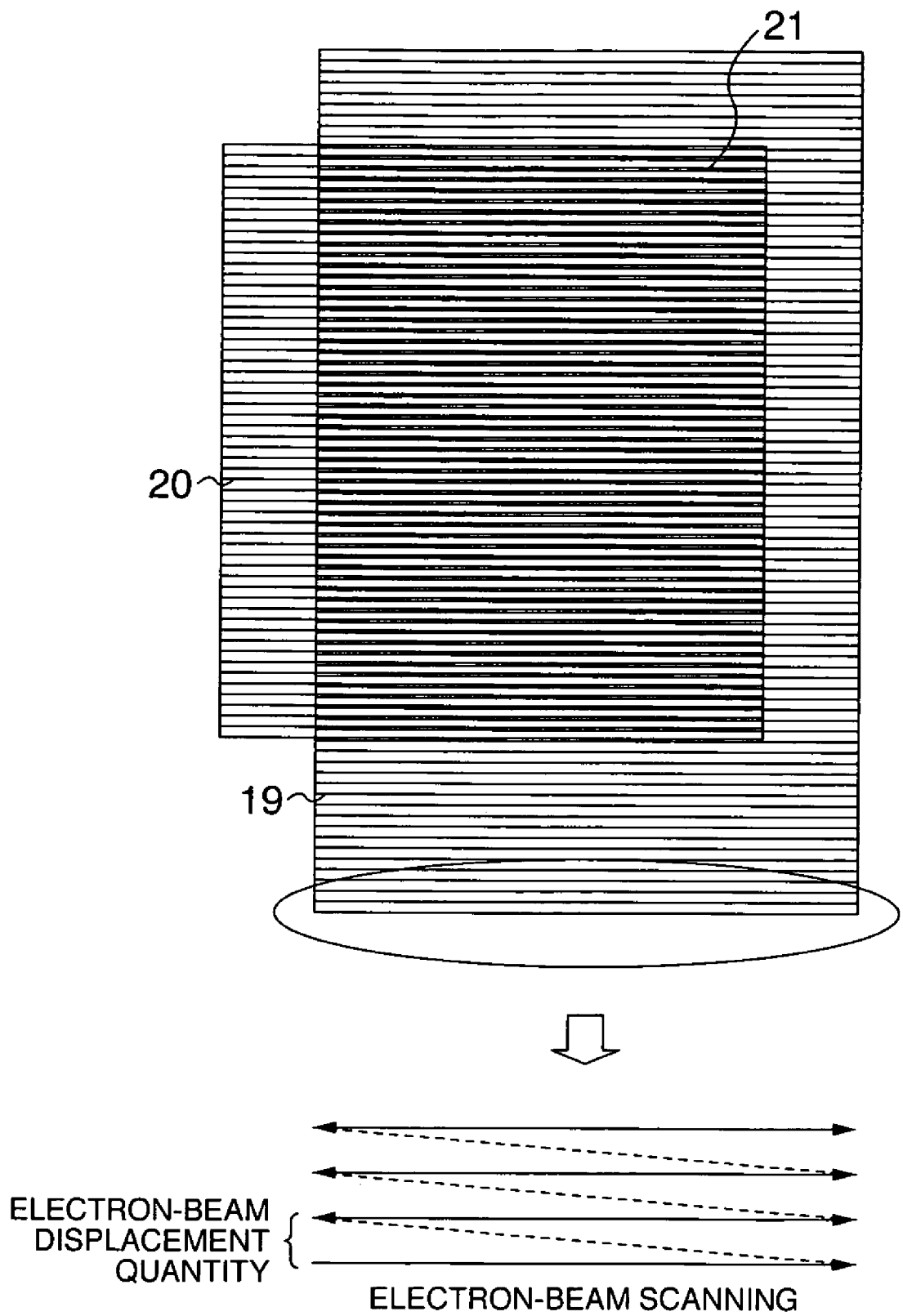
FIG. 6 is a diagram for explaining the calibration method of the present invention.

FIG. 6 illustrates a deflection status where the beam deflection displacement quantity is locally modulated. The calibration therefor will be performed in accordance with basically the same processing steps as the ones illustrated in FIG. 2. First of all, the stage 9 illustrated in FIG. 1A is displaced, thereby causing the calibrating mark 8 to be positioned directly under the electron beam. At this time, using the beam deflection control unit, the electron beam is scanned on the calibrating mark 8 while displacing the electron beam so that the electron-beam scanning displacement quantity will coincide with the pitch size of a one-dimensional diffraction grating pattern 20 determined using the optical diffraction measurement method. A secondary-electron image acquired by the scanning is displayed on the image display unit. As a result, as illustrated in FIG. 6, moiré interference fringes 21 have been observed on the diffraction grating 20 and the electron-beam scanning portion in the secondary-electron image 19. This phenomenon is caused to occur by a situation where the pitch size of the diffraction grating and the electron-beam scanning displacement quantity do not coincide with each other. In view of this situation, the beam deflection control unit will make a correction to the beam deflection displacement quantity. Namely, for example, the pitch quantity of the electron beam will be locally changed, and the electron beam is scanned once again on the one-dimensional diffraction grating pattern horizontal to the electron-beam scanning direction. Then, the beam deflection control unit will be adjusted until none of the moiré interference fringes have been observed, or until the position shift quantity has become equal to a predetermined threshold value. A calibration parameter which has locally changed the beam deflection displacement quantity is memorized into a control unit 32, or preferably the image memory unit inside the signal calculation unit. Based on this parameter, the beam deflection control unit will correct the beam deflection displacement quantity. Then, this correction result is displayed on the calibration status display unit as the secondary-electron image after being corrected. The above-described processing steps allow the beam deflection displacement quantity to be calibrated into a correct beam deflection displacement quantity with none of the moiré interference fringes appearing as illustrated in FIG. 4, thereby making it possible to display the status on the calibration status display unit.

Figure 7:
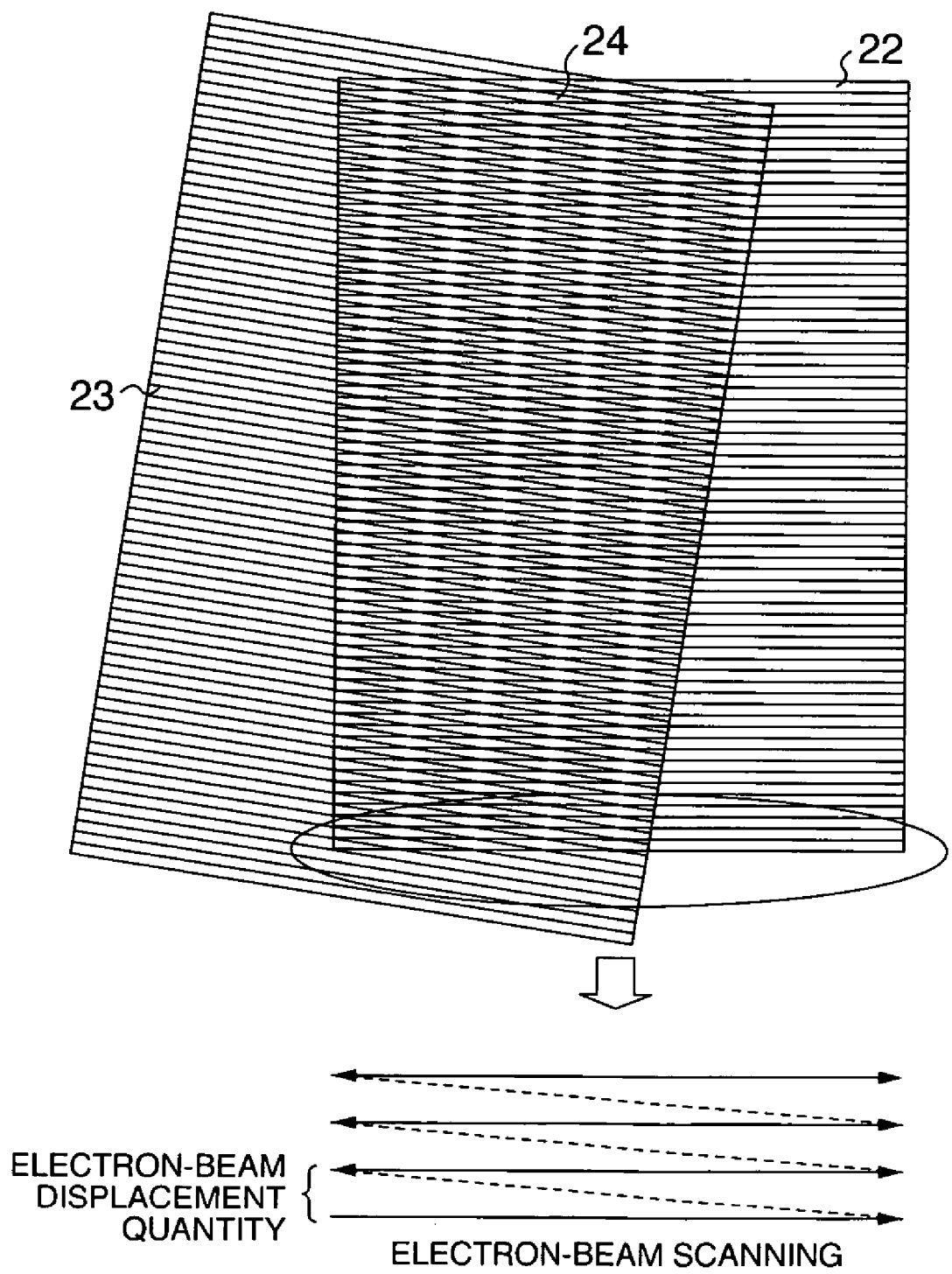
FIG. 7 is a diagram for explaining the calibration method of the present invention.

FIG. 7 illustrates a deflection status where the pitch size direction of a diffraction grating and the electron-beam scanning displacement direction do not coincide with each other. Similarly to the deflection status described earlier, the calibration therefor will be performed in accordance with the processing steps illustrated in FIG. 2. First of all, the stage 9 illustrated in FIG. 1A is displaced, thereby causing the calibrating mark 8 to be positioned directly under the electron beam. Next, the electron beam is scanned in the direction which is horizontal to a one-dimensional diffraction grating pattern 23. At this time, using the beam deflection control unit, the electron beam is scanned while displacing the electron beam in the perpendicular direction so that the electron-beam scanning displacement quantity will coincide with the pitch size of the one-dimensional diffraction grating pattern 23 determined using the optical diffraction measurement method. A secondary-electron image 22 acquired in this way is displayed on the image display unit. As a result, moiré interference fringes 24 in an oblique direction as are illustrated in FIG. 7 can be confirmed on the diffraction grating 23 and the electron-beam scanning portion in the secondary-electron image 22. This phenomenon is caused to occur by a situation where the pitch size direction of the diffraction grating and the electron-beam scanning displacement direction do not coincide with each other. In view of this situation, the beam deflection control unit will make a rotation correction to the beam deflection displacement direction, and the electron beam is scanned once again on the one-dimensional diffraction grating pattern horizontal to the electron-beam scanning direction. Then, the beam deflection control unit will be adjusted so that none of the moiré interference fringes will be observed. A calibration parameter which has added the rotation to the electron-beam scanning direction is memorized into the control unit 32, or preferably the image memory unit inside the signal calculation unit. Based on this parameter, the beam deflection control unit will correct the beam deflection displacement quantity. Then, this correction result is displayed on the calibration status display unit as the secondary-electron image after being corrected. The above-described processing steps have allowed the beam deflection displacement quantity to be calibrated into the correct beam deflection displacement quantity with none of the moiré interference fringes appearing as illustrated in FIG. 4, thereby making it possible to display the status on the calibration status display unit.

Figure 8:
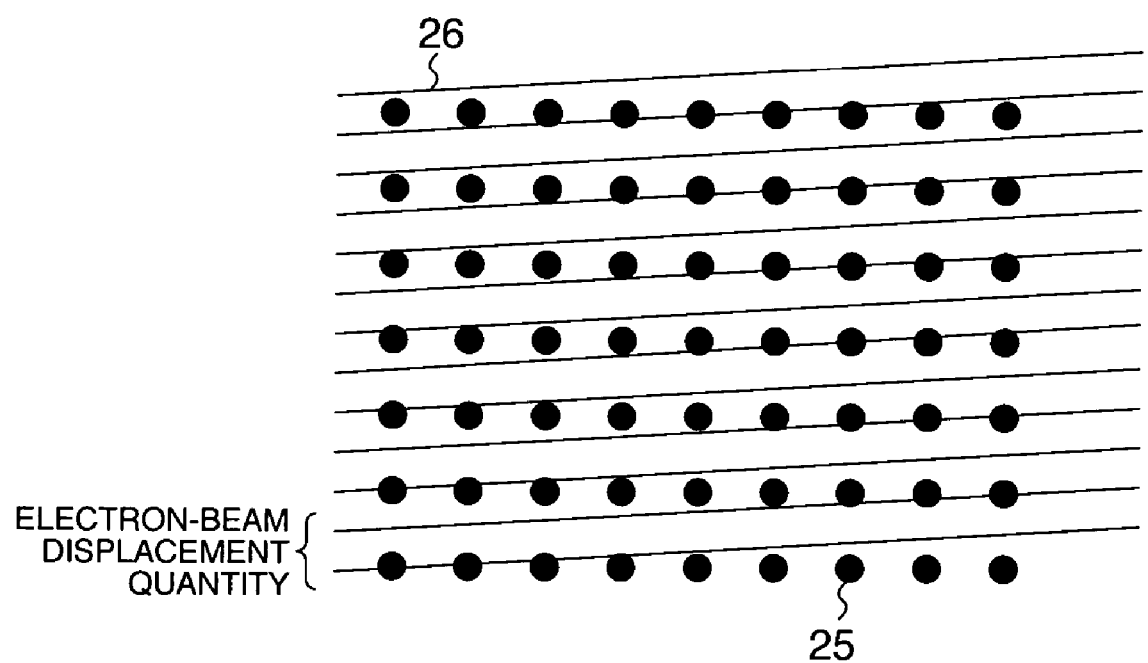
FIG. 8 is the diagram for explaining the conventional calibration method.

As described above, in the calibration according to the present embodiment, the areas are large where the one-dimensional diffraction grating and the electron beam coincide with each other. This characteristic allows the secondary-electron generation to be acquired in large quantities, thereby making it possible to obtain the secondary-electron signals with a large S/N ratio. In samples to be used in the length measurements, e.g., semiconductor samples, it is required to perform the length measurements using a low-current beam of 10 pA or less and at a low acceleration of several hundreds of volts. This low-current beam is required in order to avoid influences of electrification and beam irradiation damages especially in the case of oxide film samples and resist materials. With respect to the low-current beam of 10 pA or less and at the low acceleration of several hundreds of volts like this, the calibration according to the present embodiment has found it possible to guarantee the accuracy of 1 nm or less. In the conventional calibration method as illustrated in FIG. 8 which scans the electron beam with an angle set to the lattice-point arrangement, the locations at which the beam and the lattice points coincide with each other decrease further down to the one-tenth or less in number as compared with the present embodiment. As a result, the secondary-electron signals acquired also becomes smaller in number, i.e., the one-several-tenth or less as compared therewith. This fact has became a cause for degradation in the calibration accuracy, thus worsening the calibration accuracy to 100 nm or more.

Figure 11:
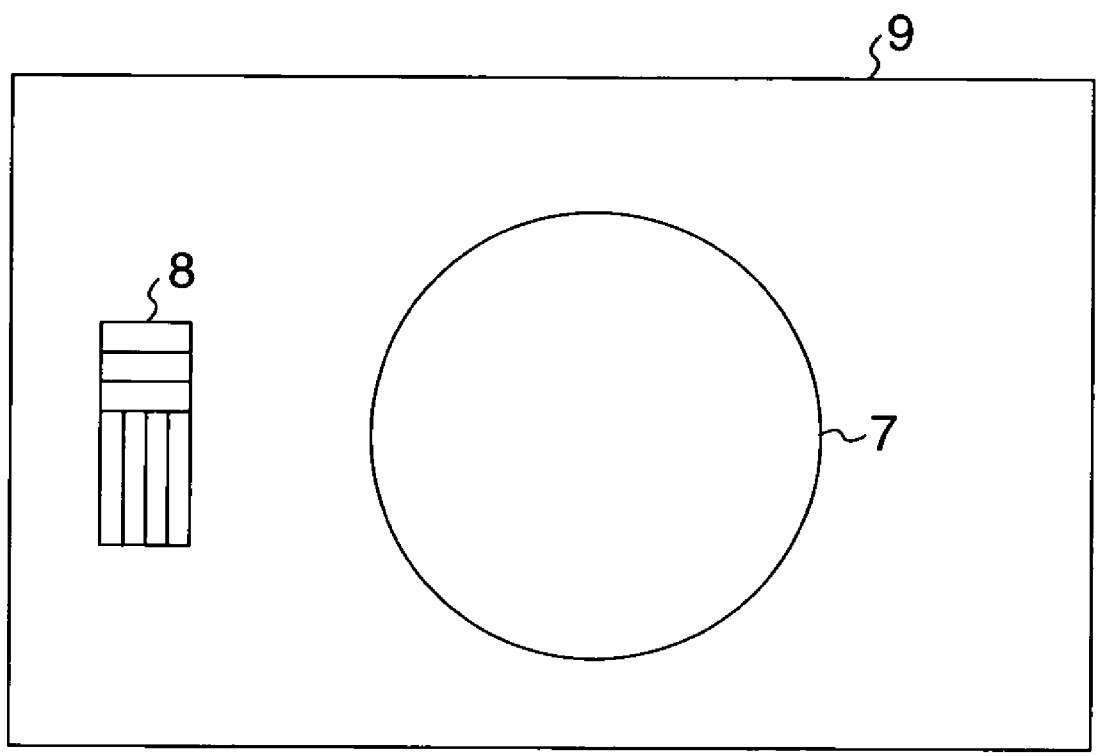
FIG. 11 is a diagram for explaining an example of diffraction-grating location of the present invention.

In the present embodiment, the explanation has been given regarding the case where the calibrating-mark substrate 8 includes not only the above-explained one-dimensional diffraction grating pattern which is perpendicular to the electron-beam scanning direction, but also the one-dimensional diffraction grating pattern which is horizontal thereto. In addition to this configuration, the following configurations are also allowable: Namely, as illustrated in FIG. 11, two calibrating-mark substrates are prepared on one and the same stage. Then, patterns of these calibrating-mark substrates are located such that the substrates become a calibrating-mark substrate of the one-dimensional diffraction grating pattern perpendicular to the scanning direction, and a calibrating-mark substrate of the one-dimensional diffraction grating pattern horizontal thereto. Also, a rotation mechanism is prepared onto the stage, thereby rotating, by 90°, the calibrating-mark substrate of the one-dimensional diffraction grating pattern perpendicular to the scanning direction. Otherwise, the rotation mechanism is prepared onto only the calibrating-mark substrate of the diffraction grating, thereby changing the one-dimensional diffraction grating pattern perpendicular to the scanning direction to the one-dimensional diffraction grating pattern horizontal thereto.

Embodiment 2

Next, the explanation will be given below concerning another embodiment.

Figure 2:
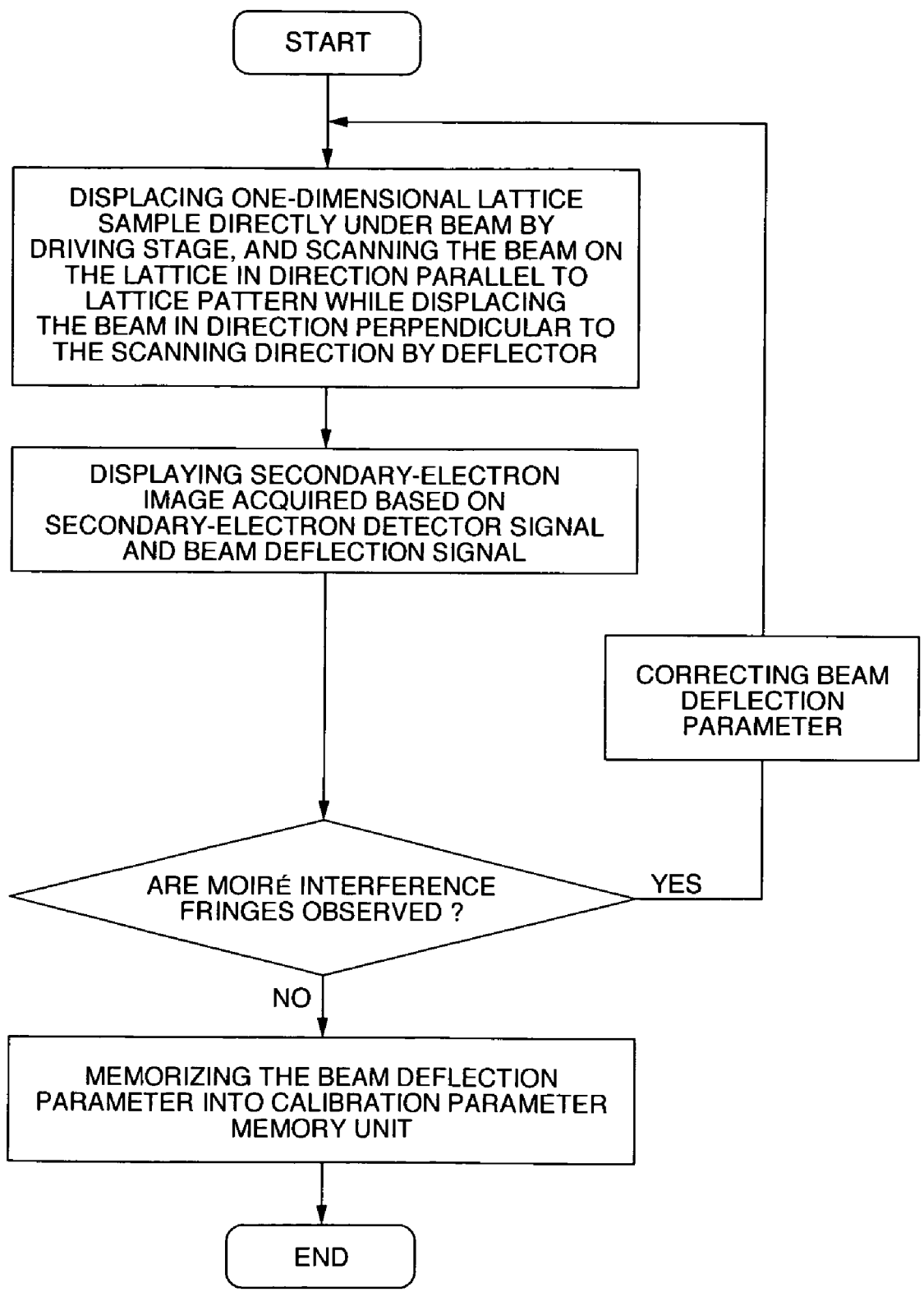
FIG. 2 is a diagram for explaining the calibration method of the present invention.

The calibration therefor will be performed in accordance with the processing steps illustrated in FIG. 2. First of all, in FIG. 1A, the stage 9 is displaced, thereby causing the calibrating mark 8 to be positioned directly under the electron beam. Next, in FIG. 3, the electron beam is scanned on the one-dimensional diffraction grating pattern 12 which is horizontal to the electron-beam scanning direction. At this time, using the beam deflection control unit, the electron beam is horizontally scanned while displacing the electron beam in the direction perpendicular to the electron-beam scanning direction with a period which is smaller than the pitch size of the one-dimensional diffraction grating pattern 12 determined using the optical diffraction measurement method. Moreover, the detection by the secondary-electron detector 10 illustrated in FIG. 1A is intermittently performed in correspondence with a period during which the electron-beam scanning is positioned on the diffraction grating. The secondary-electron image 11 acquired in this way is displayed on the image display unit. As a result, as illustrated in FIG. 3, the moiré interference fringes 13 have been observed in the electron-beam scanning portion on the above-described diffraction grating 12 in the secondary-electron image 11. This phenomenon is caused to occur by a situation where the pitch size of the diffraction grating and the electron-beam scanning displacement quantity corresponding thereto do not coincide with each other. In view of this situation, the beam deflection control unit will make a correction to the beam deflection displacement quantity. Namely, the electron beam is scanned once again on the one-dimensional diffraction grating pattern horizontal to the electron-beam scanning direction. Then, the beam deflection control unit will be adjusted so that none of the moiré interference fringes will be observed as is illustrated in FIG. 4.

As a result, in FIG. 3, it can be recognized that the beam deflection displacement quantity is uniformly larger than the pitch size of the diffraction grating. Accordingly, a calibration parameter for making the beam deflection displacement quantity uniformly smaller is memorized into the signal calculation unit. Based on this parameter, the beam deflection control unit will correct the beam deflection displacement quantity. Then, this correction result is displayed on the calibration status display unit as the secondary-electron image after being corrected. The pitch line-width of the above-described one-dimensional diffraction grating has been determined with the accuracy of 1 nm or less by using the optical diffraction measurement method. As a result, the secondary-electron image with a precise magnification can be acquired. This fact makes it possible to implement the high-accuracy length measurement, and simultaneously allows the system status to be confirmed in the calibration status display unit at whatever time.

Embodiment 3

Next, the explanation will be given below concerning still another embodiment.

Figure 9:
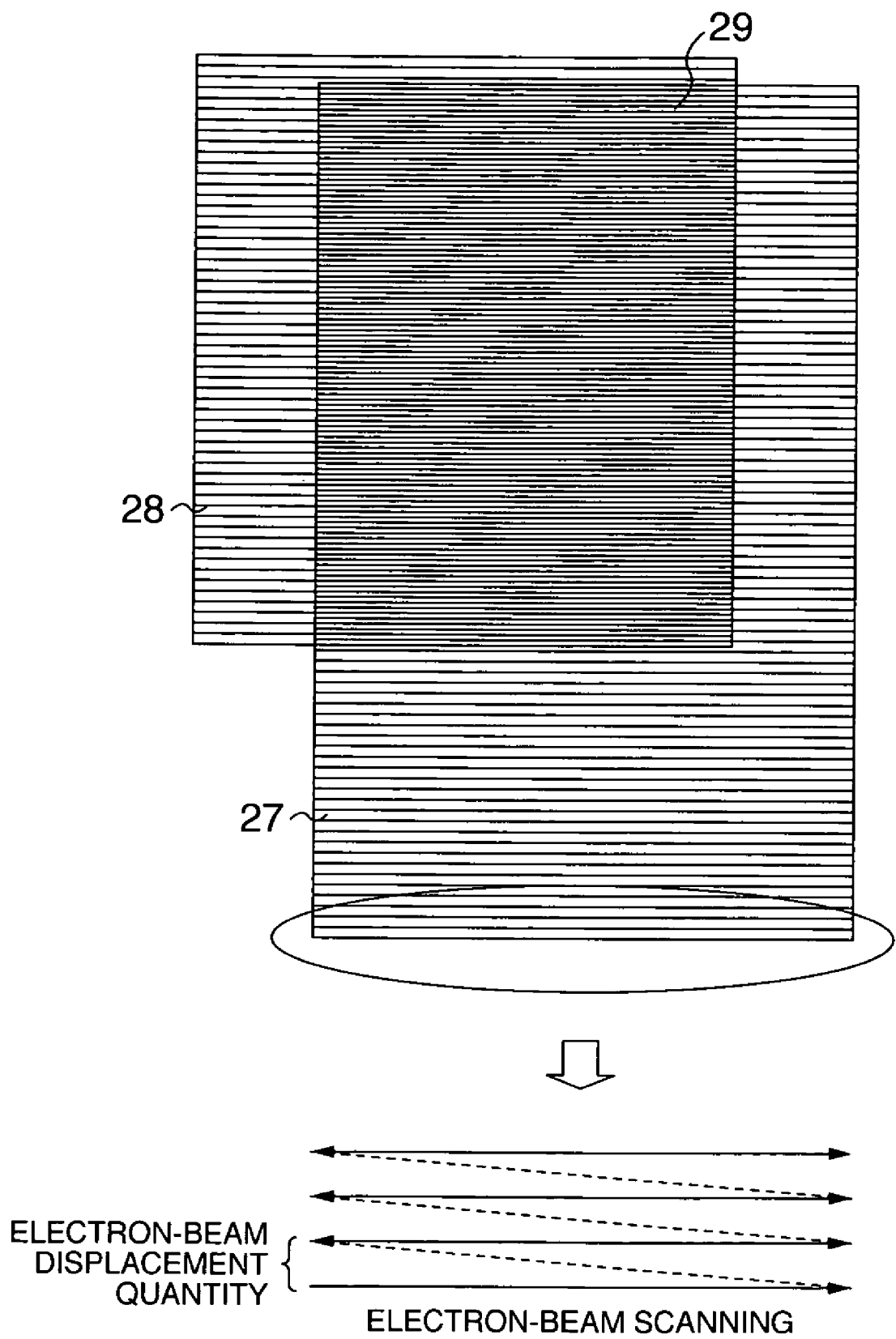
FIG. 9 is a diagram for explaining the calibration method in the third embodiment of the present invention.
Figure 10:
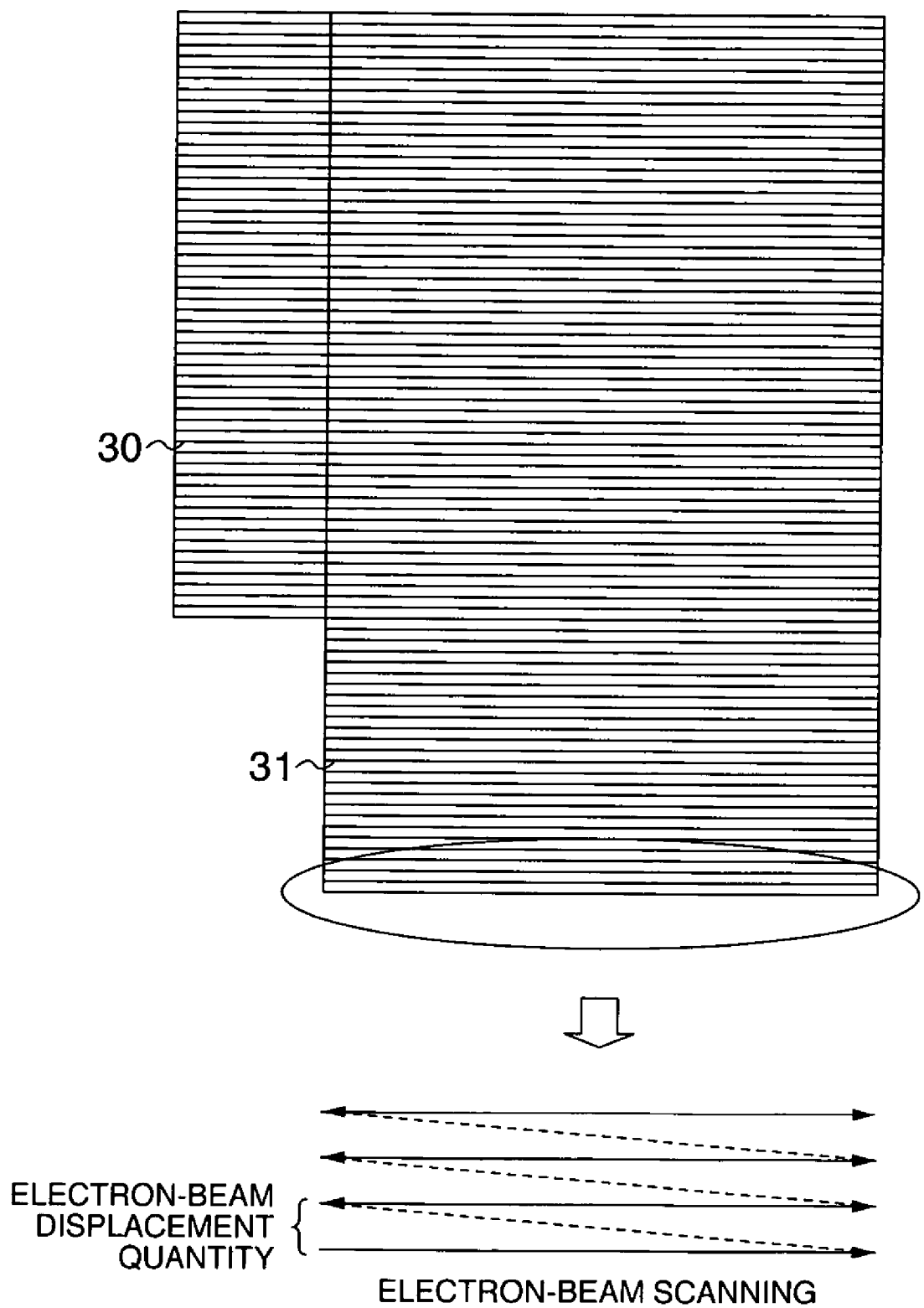
FIG. 10 is a diagram for explaining the calibration result in the third embodiment of the present invention.

The calibration therefor will be performed in accordance with the processing steps illustrated in FIG. 2. First of all, in FIG. 1A, the stage 9 is displaced, thereby causing the calibrating mark 8 to be positioned directly under the electron beam. Next, in FIG. 3, the electron beam is scanned on the one-dimensional diffraction grating pattern 12 which is horizontal to the electron-beam scanning direction. At this time, using the beam deflection control unit, the electron beam is horizontally scanned while displacing the electron beam in the direction perpendicular to the electron-beam scanning direction with a period which is smaller than the pitch size of the one-dimensional diffraction grating pattern determined using the optical diffraction measurement method. Moreover, in the signal calculation unit, an addition processing is performed between a secondary-electron image acquired as a result of the above-described electron-beam scanning, and a reference image, e.g., an ideal secondary-electron image and CAD data. Here, the reference image is memorized in the image memory unit, and corresponds to the pitch size of the one-dimensional diffraction grating. Furthermore, a consequence acquired as a result of the above-described addition processing is displayed on the image display unit. As a result, as illustrated in FIG. 9, moiré interference fringes 29 have been observed on the reference image 28 and the electron-beam scanning portion in the secondary-electron image 27. This phenomenon is caused to occur by a situation where the pitch size of the diffraction grating and the electron-beam scanning displacement quantity corresponding thereto do not coincide with each other. In view of this situation, the beam deflection control unit will make a correction to the beam deflection displacement quantity. Namely, the electron beam is scanned once again on the one-dimensional diffraction grating pattern horizontal to the electron-beam scanning direction. Then, the beam deflection control unit will be adjusted so that, as is illustrated in FIG. 10, none of the moiré interference fringes will be observed on the reference image 30 and the electron-beam scanning portion in the secondary-electron image 31.

As a result, in FIG. 3, it can be recognized that the beam deflection displacement quantity is uniformly larger than the pitch size of the diffraction grating. Accordingly, a calibration parameter for making the beam deflection displacement quantity uniformly smaller is memorized into the signal calculation unit. Based on this parameter, the beam deflection control unit will correct the beam deflection displacement quantity. Then, this correction result is displayed on the calibration status display unit as the secondary-electron image 31 after being corrected. The pitch line-width of the one-dimensional diffraction grating has been determined with the accuracy of 1 nm or less by using the optical diffraction measurement method. As a result, the secondary-electron image with a precise magnification can be acquired. This fact makes it possible to implement the high-accuracy length measurement, and simultaneously allows the system status to be confirmed in the calibration status display unit at whatever time. As the above-described one-dimensional diffraction grating, the following diffraction gratings have been employed: The diffraction grating manufactured on the silicon substrate using the laser interference exposure method and anisotropic etching, or the diffraction grating using the superlattice cross-section structure of the multi-layer crystal composed of compound semiconductors.

As having been explained in detail in the above-described embodiments, according to the present invention, it becomes possible to calibrate the deflection distortion in the electron-beam system with an excellent accuracy.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron-beam calibration method for an electron-beam system including at least an electron source for emitting an electron beam, a stage for mounting a sample thereon, deflection means, an objective lens, and a calibrating mark, said electron-beam calibration method comprising the steps of:

scanning said electron beam on said calibrating mark in a first direction parallel to a one-dimensional diffraction grating pattern arranged with a predetermined pitch size;

displacing by said deflection means, said scanning position in a second direction perpendicular to said first direction, and by an amount corresponding to said pitch size of said diffraction grating, scanning said electron beam in said first direction parallel to said one-dimensional diffraction grating pattern;

detecting reflected electrons or secondary electrons emitted from said calibrating mark; and performing, from said detection result, calibration for a deflection direction or a deflection quantity of said electron beam.

2. An electron-beam calibration method for an electron-beam system including at least an electron source for emitting an electron beam, a stage for mounting a sample thereon, deflection means, an objective lens, and a calibrating mark, said electron-beam calibration method comprising the steps of:

scanning said electron beam on said calibrating mark in a first direction parallel to a one-dimensional diffraction grating pattern arranged with a predetermined pitch size;

displacing said electron beam in a second direction perpendicular to said one-dimensional diffraction grating pattern, scanning said electron beam once again in first said direction parallel to said one-dimensional diffraction grating pattern;

detecting reflected electrons or secondary electrons over an interval time, said reflected electrons or secondary electrons being emitted from said calibrating mark, said interval time corresponding to a time cycle for which said displacing coincides with a pitch size of said one dimensional diffraction grating pattern; and performing, from said detection result, calibration for a deflection direction or a deflection quantity of said electron beam.

3. The electron-beam calibration method according to claim 1, further comprising the steps of:

making a comparison between a reflected-electron image or a secondary-electron image acquired from said detection result and a reference image memorized in advance; and performing, from said comparison result, said calibration for said deflection direction or said deflection quantity of said electron beam.

4. The electron-beam calibration method according to claim 3, wherein said detection result or said comparison result is a moiré pattern.

5. The electron-beam calibration method according to claim 1, wherein said pitch size of said one-dimensional diffraction grating pattern is a diffraction grating pattern pitch size determined based on an optical diffraction.

6. The electron-beam calibration method according to claim 1, wherein said one-dimensional diffraction grating pattern is of a superlattice multi-layer cross-section structure.

7. An electron-beam system, comprising:

an electron source for emitting an electron beam;
a deflector;
an objective lens;
a stage for mounting a sample thereon;
a calibrating mark for calibrating an irradiation position with said electron beam; and
an electron detector for detecting reflected electrons or secondary electrons generated by said irradiation with said electron beam, wherein said calibrating mark includes a one-dimensional diffraction grating pattern arranged with a predetermined pitch size, said electron-beam system further comprising:

a control unit for scanning said electron beam in a first direction parallel to said one-dimensional diffraction grating pattern, and displacing said scanning position in a second direction and scanning said electron beam again in said first direction, said second direction being perpendicular to said one-dimensional diffraction grating pattern; and a display unit for displaying a reflected-electron image or a secondary-electron image acquired by said scanning.

8. The electron-beam system according to claim 7, wherein said control unit displaces said scanning position in said second direction and in correspondence with said pitch spacing of said diffraction grating.

9. The electron-beam system according to claim 7, wherein said control unit comprises:

a signal analysis unit for making a comparison between said reflected-electron image or said secondary-electron image and a reference image memorized in advance, said reflected-electron image or said secondary-electron image being acquired by scanning said electron beam in said first direction parallel to said one-dimensional diffraction grating pattern; and a deflection control unit for correcting a deflection quantity of said electron beam based on said comparison result.

10. The electron-beam system according to claim 9, wherein said comparison result is displayed on said display unit.

11. The electron-beam system according to claim 7, wherein said control unit comprises:

a signal processing unit for controlling said electron detector to detect said reflected electrons or secondary electrons with a period corresponding to said pitch spacing of said one-dimensional diffraction grating pattern, said reflected electrons or secondary electrons being emitted from said calibrating mark by said scanning of said electron beam;

a signal calculation unit for calculating a scanning-position shift quantity from said reflected-electron image or said secondary-electron image detected and said one-dimensional diffraction grating pattern; and a deflection control unit for correcting a deflection quantity of said electron beam based on said calculation result.

12. The electron-beam system according to claim 7, wherein said pitch size of said one-dimensional diffraction grating pattern is a diffraction grating pattern pitch size determined based on an optical diffraction.

13. The electron-beam system according to claim 7, wherein said one-dimensional diffraction grating pattern is of a superlattice multi-layer cross-section structure.

14. The electron-beam system according to claim 7, wherein said calibrating mark is located on said stage.

* * * * *